(12) United States Patent
Lang et al.

(10) Patent No.: US 7,200,721 B1
(45) Date of Patent: Apr. 3, 2007

(54) VERIFICATION OF MEMORY OPERATIONS BY MULTIPLE PROCESSORS TO A SHARED MEMORY

(75) Inventors: Michelle J. Lang, Minneapolis, MN (US); William Judge Yohn, Shoreview, MN (US)

(73) Assignee: Unisys Corporation, Blue Bell, PA (US)

( * ) Notice: Subject to any disclaimer, the term of this patent is extended or adjusted under 35 U.S.C. 154(b) by 1015 days.

(21) Appl. No.: 10/268,238

(22) Filed: Oct. 9, 2002

(51) Int. Cl.
  *G06F 12/00* (2006.01)
(52) U.S. Cl. .................... 711/141; 711/129; 711/153
(58) Field of Classification Search ............... 711/141, 711/129, 153
  See application file for complete search history.

(56) References Cited

U.S. PATENT DOCUMENTS

| | | | |
|---|---|---|---|
| 6,301,616 B1 * | 10/2001 | Pal et al. .................... 709/226 |
| 6,430,648 B1 * | 8/2002 | Carnevale ....................... 711/5 |
| 6,535,905 B1 * | 3/2003 | Kalafatis et al. ............ 718/108 |
| 6,889,159 B2 * | 5/2005 | Klotz et al. ................. 702/122 |

* cited by examiner

*Primary Examiner*—Sanjiv Shah
*Assistant Examiner*—Arpan Savla
(74) *Attorney, Agent, or Firm*—Charles A. Johnson; Mark T. Starr; Crawford Maunu PLLC

(57) ABSTRACT

A method and apparatus for testing cache coherency in a multiprocessor data processing arrangement. Selected values are written to memory by a plurality of threads, and consistency of the values in the memory with the values written by the plurality of threads is verified. Performance characteristics of the data processing system are measured while writing the values, and in response to the performance characteristics relative to target performance characteristics, parameters that control writing by the plurality of threads are selectively adjusted.

21 Claims, 5 Drawing Sheets

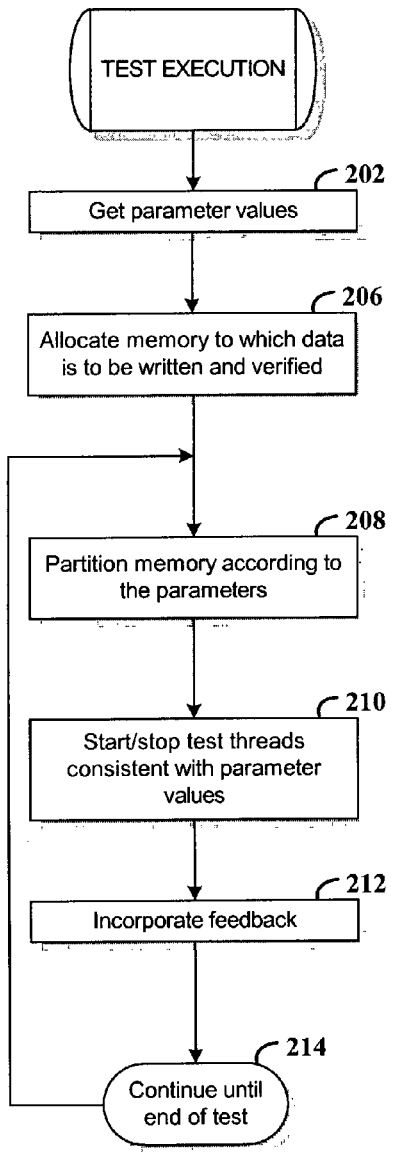
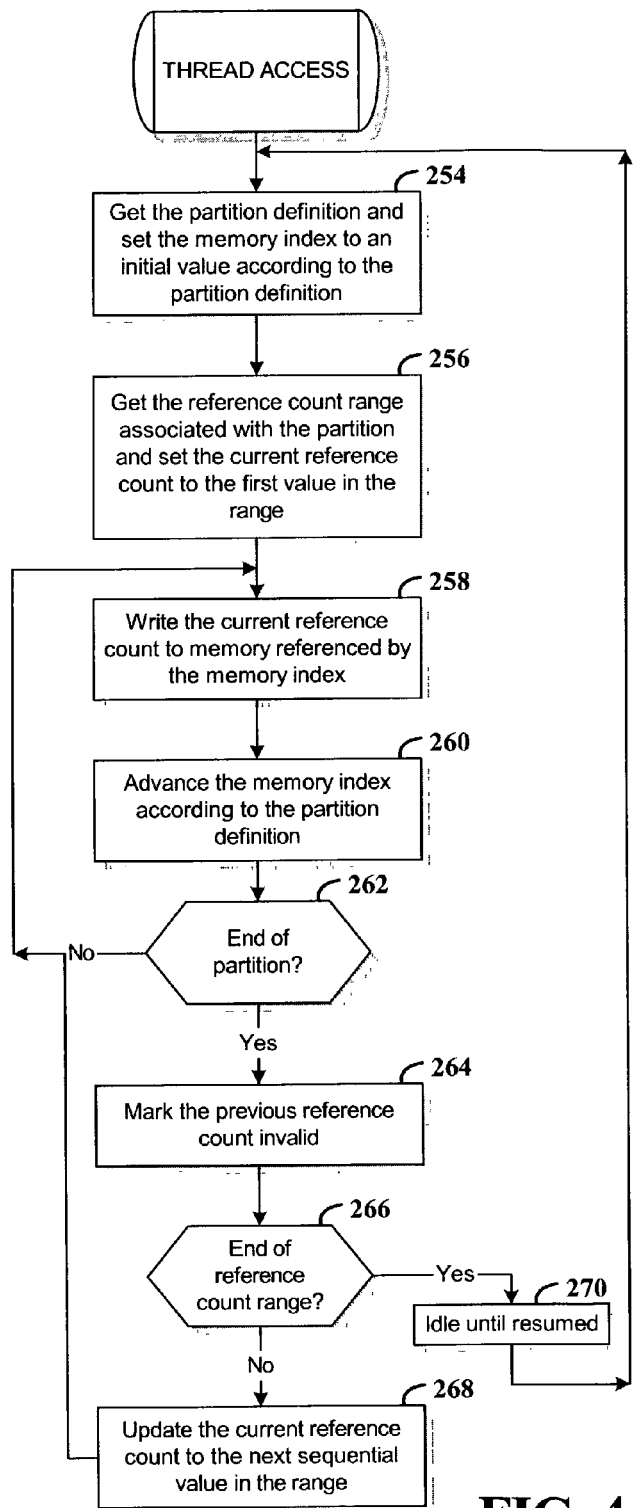
FIG. 3
FIG. 4

VERIFICATION OF MEMORY OPERATIONS BY MULTIPLE PROCESSORS TO A SHARED MEMORY

FIELD OF THE INVENTION

The present invention relates to testing cache coherency of a multiprocessor data processing system.

BACKGROUND OF THE INVENTION

In order to validate proper functioning of a memory/cache coherency model in a multiprocessor system, it is important to test conditions involving simultaneous access and update of the same cache lines, memory pages, memory segments, and other architecturally defined structures from threads executing on different processors. Generally, by the time that a system reaches the system testing stage in a product development cycle, the majority of functional errors are likely to have been identified and fixed. Testing for any remaining problems tends to require complicated interactions and concurrent activity.

Verifying data integrity under these conditions is challenging. If no control is exerted over concurrent write operations, no prediction can be made as to those data values that constitute valid data. However, too much program control may defeat the purpose of the test. That is, with too much program control of concurrency the test program is essentially validated instead of the system cache coherency.

A method and apparatus that addresses the aforementioned problems, as well as other related problems, are therefore desirable.

SUMMARY OF THE INVENTION

In various embodiments, the invention tests cache coherency in a multiprocessor data processing arrangement, and in a feedback loop parameters used to test the cache coherency are updated based on system performance characteristics. Selected values are written to memory by a plurality of threads, and consistency of the values in the memory with the values written by the plurality of threads is verified. Performance characteristics of the data processing system are measured while writing the values, and in response to the performance characteristics relative to target performance characteristics, parameters that control writing by the plurality of threads are selectively adjusted.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Other aspects and advantages of the invention will become apparent upon review of the Detailed Description and upon reference to the drawings in which:

FIG. 3 is a flowchart of a process for controlling a cache coherency test in accordance with one embodiment of the invention;

FIG. 4 is a flowchart of an example process by which a thread makes access to a partition;

DETAILED DESCRIPTION

Figure 1:
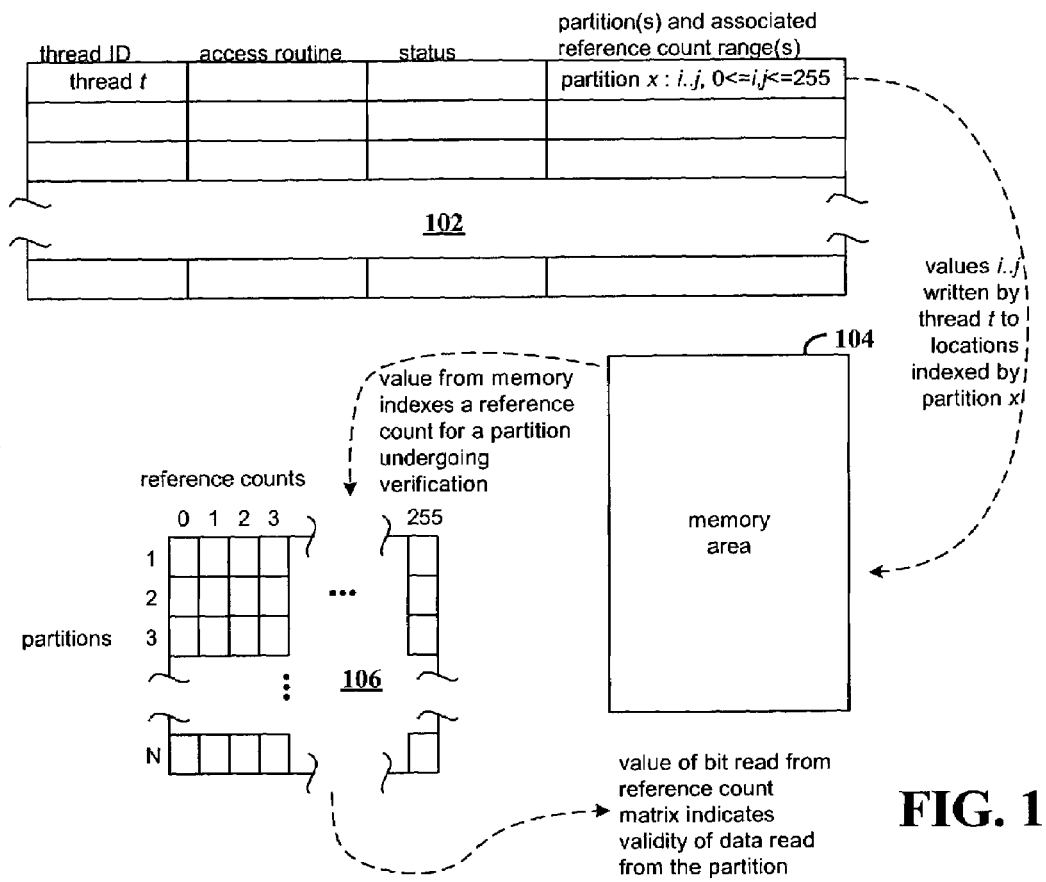
FIG. 1 illustrates the relationship between a thread control table, an area of memory to which data values are written, and a reference count matrix that indicates the validity of data read from the memory.

FIG. 1 illustrates the relationship between the thread control table 102, an area 104 of memory to which data values are written, and a reference count matrix 106 that indicates the validity of data read from the memory.

In various embodiments of the invention, multiple active threads concurrently execute on different physical processors, each thread having the ability to update and access data within the same bytes, cache-lines, and pages. The number of threads may vary over time. Assigning each thread to a processor reduces the overhead incurred by context switches, operating system overhead, and the associated cache flushes and invalidations. However, no specific knowledge of the processor on which each thread is executing is required for verifying data coherency.

Multiple threads are created at the beginning of a test, the number depending on specific test requirements. Information on the state of each thread is stored in a thread control table 102. Each thread need only have access to its associated entry. A main controller thread uses the information in the thread control table to monitor whether threads are active or inactive. Information concerning the state of each thread can be output when an error is detected.

The memory area 104 is created for use by the threads. Within certain pre-defined rules, the threads are allowed to simultaneously read, write and perform input/output to this area. The data in memory area 104 is continually validated for expected values. Data validation can be performed by any thread, and the timing is not dependent on the status of other threads. There is no requirement that the memory area be restricted to any particular memory module or physical memory range. The virtual-to-absolute address translation rules ensure that consecutive bytes in virtual address space represent consecutive bytes in real address space for all bytes within a page boundary. One embodiment of the invention also allows threads to vary memory access patterns.

The invention allows the size of the target memory size to be varied over the course of a test. For example, the target memory size may be varied from a single cache line or byte to many pages or mega-bytes of data. In one embodiment, the target memory size is controlled through logical partitioning. The logical partitioning of the memory area 104 involves dividing the memory range into multiple, non-overlapping areas of memory called partitions. A partition need not be defined by contiguous memory locations. Because the partitioning is logical, the partitioning can be performed prior to commencing memory access and prior to creating any threads. Multiple partitioning schemes can be defined in advance of being used, thereby limiting the number of extraneous references needed while testing is underway. Only one partitioning scheme can be active at a time. However, a test has the option to switch from one partitioning scheme to another for different testing scenarios.

The examples below illustrate different partitioning schemes for a hypothetical 16 mega-byte target memory area. In the examples, the values within "[ ]" represent the values at bytes in the memory area, "1" indicates a byte of data that belongs to partition 1, "2" indicates a byte of data that belongs to partition 2, etc.

```
[1111111111111111111111111.....1111111111111111111111111111111111111111]
 1                                                                   16M
```

EXAMPLE 1

In Example 1, all the bytes are in a single partition.

```
[111111...1111111]
 1              4K
```

```
[111112222222222222222331111111111122333333333333344444.......xxxx11111]
 1                                                                   16M
```

EXAMPLE 2

In Example 2, the memory size is limited to 4 kilo-bytes, and there is only a single partition.

```
[1111...1112222...2223333...3334444...444]
 1      4M      8M      12M     16M
```

EXAMPLE 3

In Example 3, the memory is divided into 4 contiguous partitions of 4 mega-bytes.

```
[111111112222222233333331111111122222222333333...2222222233333333]
 word 1  word 2  word 3  word 4  word 5  word 6           word
8*10
```

EXAMPLE 4

In Example 4, 80 words of the 16 mega-byte memory are divided into three non-contiguous partitions, where each partition is assigned every third word, and assuming 8 bytes/word.

```
[1212121212121212...12121212]
 1                       16M
```

EXAMPLE 5

In Example 5, there are two partitions that together cover 16 mega-bytes, with the first partition covering odd bytes and the second partition covering even bytes.

```
[132456...n123456...n123456...n...123456...n]
 cache line 1                     cache line m
```

EXAMPLE 6

In Example 6, n is the number of bytes/cache line, each byte in a cache line is in a different partition, and m cache lines are tested.

EXAMPLE 7

Example 7 represents a random, non-uniform partitioning of the entire memory area.

In an example embodiment, each partition is defined by a beginning offset, an ending offset, a contiguous byte count, and an increment value. The beginning offset is the position in the memory area 104, relative to the starting address of the memory area, at which the partition begins. The ending offset is the relative address in the memory area at which the partition ends. The contiguous byte count is the number of consecutive bytes that belong to the partition before a byte not in the partition is encountered. The increment value is the number of bytes that are not in the partition and are between two sets of contiguous bytes of the partition. In example 5 above, the partition definitions are:

partition 1: beg. offset=0; ending offset=16M; contiguous bytes=1; increment=1;

partition 2: beg. offset=1; ending offset=16M−1; contiguous bytes=1; increment=1;

One of the facilities provided by the aforementioned partitioning scheme is that data coherency can be verified under varied timing conditions and in a manner not possible with other partitioning schemes. The number of contiguous bytes, increment bytes and their groups determines the duration and frequencies of both read and write operations. This then generates considerable variation in the timing of data access operations, provides greater coverage of infrequent access conditions and prevents the test from becoming "grooved".

The thread control table 102, memory area 104, and reference count matrix 106 are used in verifying cache coherency. Cache coherency is inferred when expected values are read from the memory area 104. The threads described in the thread control table write values to the memory area consistent with the associated partition definitions, reference count ranges, and access routines. A verification routine is called upon to verify the validity of the values residing in the memory area.

The partition to which a thread writes has an associated reference count range, as shown in table 102. The values in the reference count range are the values that are written to the partition. In an example embodiment, the thread writes one of the reference count values to each address in the partition, and the verification routine is then called upon to read the values at the addresses of the partition and verify the values read are those expected. The verification routine reads a value from the partition, and uses the value, along with the partition number, to index into the reference count matrix 106. The reference count matrix has a row for each partition, and a column for each reference count value. A value in the reference count matrix indicates whether or not the indexing reference count value is being used in the corresponding partition. A value of 1 indicates that the indexing reference count is in use in the partition, and a value of 0 indicates that the reference count is not in use. Thus, if the value read from the partition, along with the corresponding partition, indexes into the reference count matrix 106 to a value 1, the value in the partition is valid. A 0 value indicates that the value read from the partition is invalid, and therefore, may be indicative of a cache coherency problem.

The thread control table 102 includes an entry for each available thread. Each entry includes a thread identifier (ID), an access routine specification, a status, and a partition and associated reference count range. The thread ID identifies the thread. The access routine specification specifies the type of access made to the partition by the thread. For example, access is viewed as being in one of the following general categories: read operations, write operations, both read and write operations, write operations and immediate verification, and verification. The selected access routine depends on test objectives. The status indicates whether the thread is active or idle.

Figure 2:
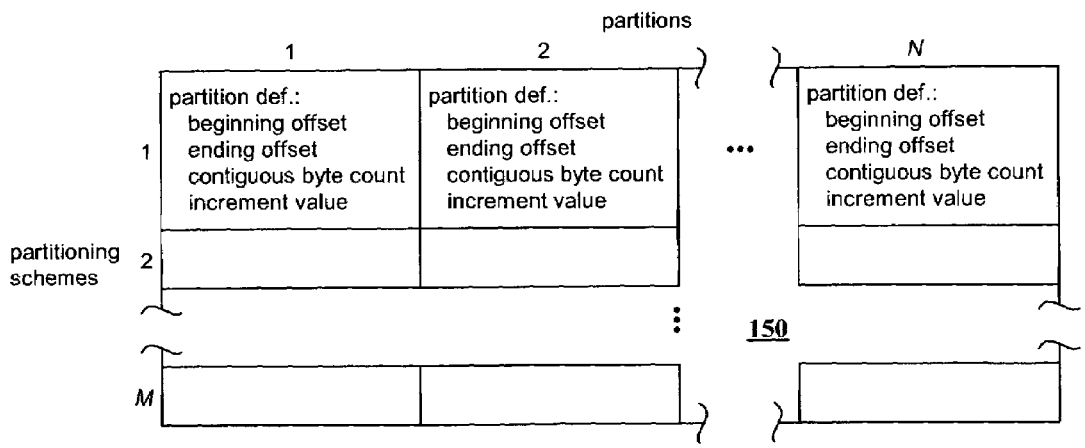
FIG. 2 illustrates a table used to manage partition schemes for partitions of the area of memory used for cache coherency testing in accordance with another embodiment of the invention.

FIG. 2 illustrates a table used to manage partition schemes for partitions of the area of memory used for cache coherency testing in accordance with another embodiment of the invention. Partition definitions are associated in groups to form a partitioning scheme. Multiple partitioning schemes are created prior to testing and stored in an M×N matrix 150, where M is the number of partitioning schemes, and N is the maximum number of partition definitions used in a partitioning scheme. One partition scheme is selected and used during a test.

In addition to managing and controlling simultaneous access to a target memory area, partitions can also be used to limit the amount of memory that is accessed or forcing more concurrency on particular architectural boundaries, such as cache lines, supersets, segments or pages. The size of the area and the logical partitioning both influence the amount of simultaneous access that can be expected with a given number of threads.

FIG. 3 is a flowchart of a process for controlling a cache coherency test in accordance with one embodiment of the invention. A main test execution process controls the selection of partitioning schemes and activation of threads in performing a desired test. Feedback of system operational characteristics is used to adjust the test characteristics in order to develop desirable parameter values and achieve certain test objectives.

The test execution begins by getting a set of parameter values (step 202). The parameters include, for example, the number of threads, the types of access routines, the partitioning scheme, and reference count ranges for different thread access functions. The memory area 104 to be used by the threads is allocated (step 206), with the quantity determined by the particular test.

The memory area is partitioned according to the selected partitioning scheme (step 208) by associating the partition definitions with the threads in the control table 102.

The partitioning also entails establishing reference count ranges for the threads. For threads operating within the same partition, the assigned reference count ranges must not overlap. As between two threads that operate in different partitions, the reference count ranges may overlap. The use of reference count ranges supports detection of error conditions such as old data, which is data that was previously valid but subsequently overwritten with new data. Error conditions related to invalidation, purge, flush, and ownership would also be revealed with the described partitioning and reference counts. After the partitioning, the threads are then started (step 210).

Figure 6:
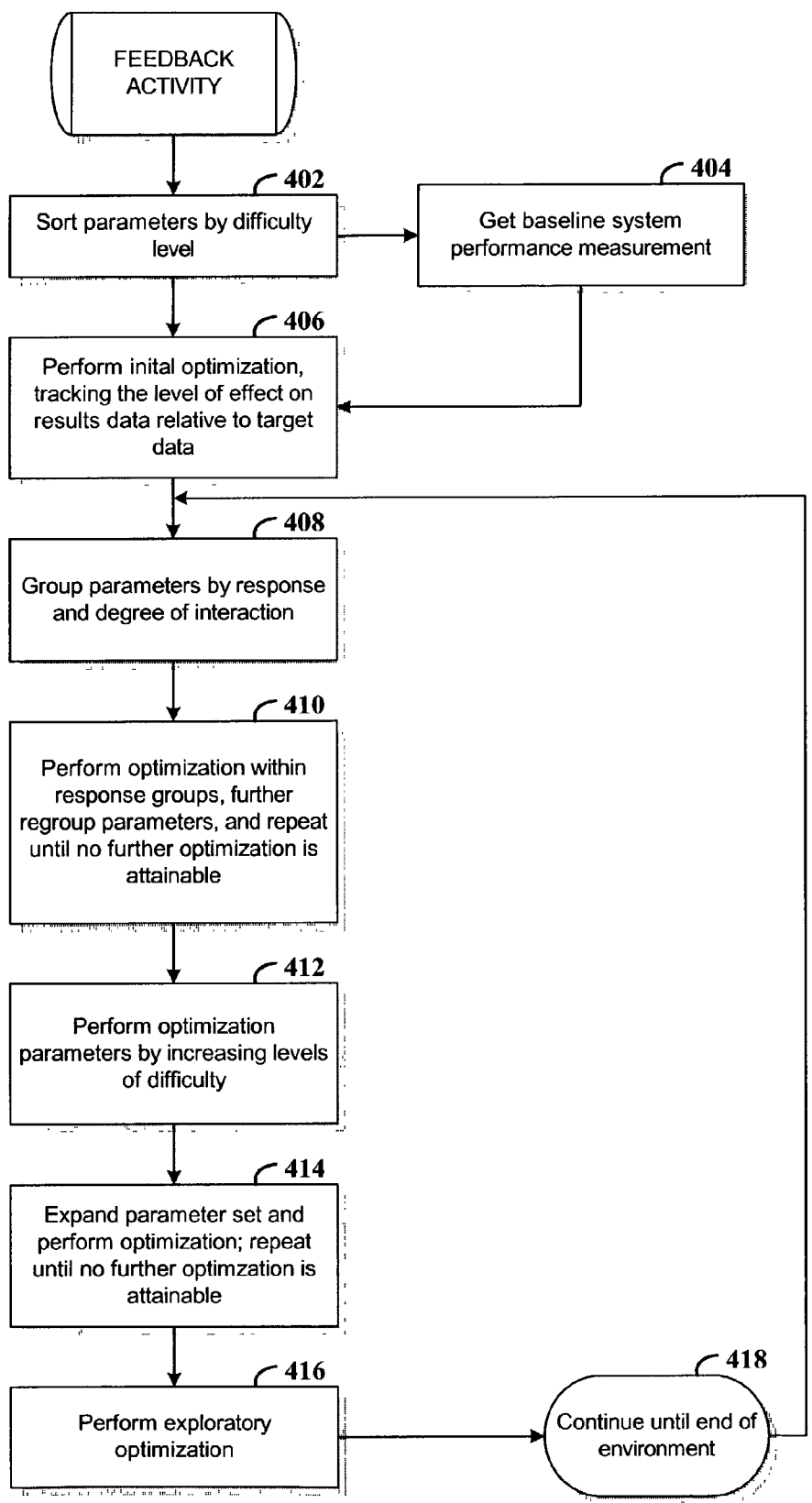
FIG. 6 is a flowchart of a process performed by a feedback activity.

Concurrent with processing by the test execution process, a feedback activity monitors system performance characteristics and adjusts parameter values in order to achieve a certain test objective (FIG. 6). The feedback activity is used to evolve parameter sets. Further information on evolving parameter sets is found in the following patents applications: "METHOD AND SYSTEM FOR TESTING A COMPUTING ARRANGEMENT" by Lang et al., filed on Jun. 6, 2002, having patent application Ser. No. 10/164,877; and "METHOD AND SYSTEM FOR GENERATING SETS OF PARAMETER VALUES FOR TEST SCENARIOS" by Lang et al., filed on Jun. 6, 2002, having patent application Ser. No. 10/165,506. The contents of these patents/applications are incorporated herein by reference. The test execution process incorporates changes to the parameters (step 212) before continuing with the remainder of the test (step 214). Example changes include the number of active threads, a change in partitioning scheme, and changes in reference count ranges.

FIG. 4 is a flowchart of an example process by which a thread makes access to a partition. In the example process the thread writes values to the assigned partition of the memory area, and the verification thread verifies that the expected values are present in the partition.

The thread obtains the definition of the assigned partition (step 254) from the partitioning scheme table 150. The assigned partition is determined from the thread control table 102. The initial value of the index used to update the memory area is set to the beginning offset of the partition definition. The thread also obtains the reference count range to be used in writing to the partition (step 256). The first value in the reference count range is selected to be written to the partition. The specific value that is selected depends on test requirements. The current reference count range for a given access function is determined by the test. However, in an example embodiment for a given range of reference counts the actual utilization begins with the lowest value in that range and progresses to the highest. For example, if the range 10–15 is assigned to a particular access thread, the thread begins by writing 10 then 11 and so on.

The reference count concept requires that ranges be allocated consecutively and that values within each range be referenced sequentially. When the test begins reference count ranges are allocated beginning at 0 and continuing until the reference counts are exhausted. Each thread that selects a write function will acquire a reference count range that begins with the end of the previously allocated reference count range +1 and extends for some number of sequential values. This continues until all available reference counts have been allocated.

For example:
    T1—range 0–4
    T2—range 5–11
    :
    Tn—range 246—Max_Reference_Count (249)

When all reference counts have been assigned, no further write functions can take place until all active write functions have been completed. At that time the reference counts are reinitialized and ranges can be assigned starting at 0. Each thread will utilize its reference count range in a sequential manner. In the above example thread T1 will first write 0's, then 1's up to and including 4's. The sequential assignment is imperative for the philosophy to work correctly. In another embodiment, the ranges are assigned and accessed in descending order. However, this type of embodiment is complex.

The selected reference count value is written to the memory area as addressed by the memory index (step 258). In another embodiment, the reference count is used in combination with an address tag. For example, if the memory area is restricted to a 16 Mbyte area, a single byte reference count can be combined with a 3-byte address tag to uniquely identify the location of any word (4 bytes) of data. These 4 bytes must align with a 4-byte boundary relative to the beginning of the partition, but would not need to be transferred in one instruction. For partitions containing contiguous byte ranges of fewer than 4 bytes, or access routines with non-sequential memory access, the data can be transferred a single byte at a time. While each integer is aligned on a modulus 4 boundary, all bytes of the integer do not have to be written. It is only necessary to write each of the 4 bytes if the entire address tag and reference count are to be verified. If a partition exists such that a contiguous byte count ends at the $3^{rd}$ byte of an integer, the $1^{st}$ 2 bytes will be written and subsequently verified. Hence, the reference count and $1^{st}$ address byte can be verified, thereby providing partial verification for that particular integer.

Whether or not the address tags are used, each thread must adhere to the following rules when modifying a partition: 1) all bytes in the assigned partition must be modified; 2) the assigned reference count range must be used; 3) all the bytes in the partition must be written with one reference count value before beginning to write another value in the range; and 4) no other partitions can be modified by the thread. Even though every byte in the partition must be modified with a reference count value before using another value, the values in the range need not be used sequentially. Thus, the values could be used in reverse order or any other order. Various access patterns can be incorporated to stress different aspects of the cache. For example, for a relatively contiguous partition, an access pattern involves updating a single byte from each cache-line before going back and writing the next byte. In addition, the bytes of a partition may be written in a random order, provided that all unwritten bytes are updated. A partition may also be updated using instructions that update multiple words.

After writing the current reference count value to the partition, the thread advances the memory index according to the partition definition. Specifically, the memory index is incremented by one until the contiguous byte count (of the partition definition) is reached. When the contiguous byte count is reached, the memory index is incremented by the increment value. It will be appreciated that the memory index need not be advanced incrementally through the partition. However, in such an embodiment the thread must track which bytes of the partition remain to be written, and an unwritten byte must be selected for the new value of the memory index.

When all the bytes in the partition have been written with a reference count value (decision step 262), the entry in the reference count matrix 106 for the previous reference count value is marked invalid (step 264). This indicates that there should be no remaining bytes in the partition having the previous reference count value. If there are unused values in the reference count range (decision step 266), the thread selects an unused reference count value to use as the current reference count value (step 268), and the thread resumes writing the current reference count value to the partition (step 258). Otherwise, the thread idles (step 270) until the controlling test execution process reactivates the thread.

Figure 5:
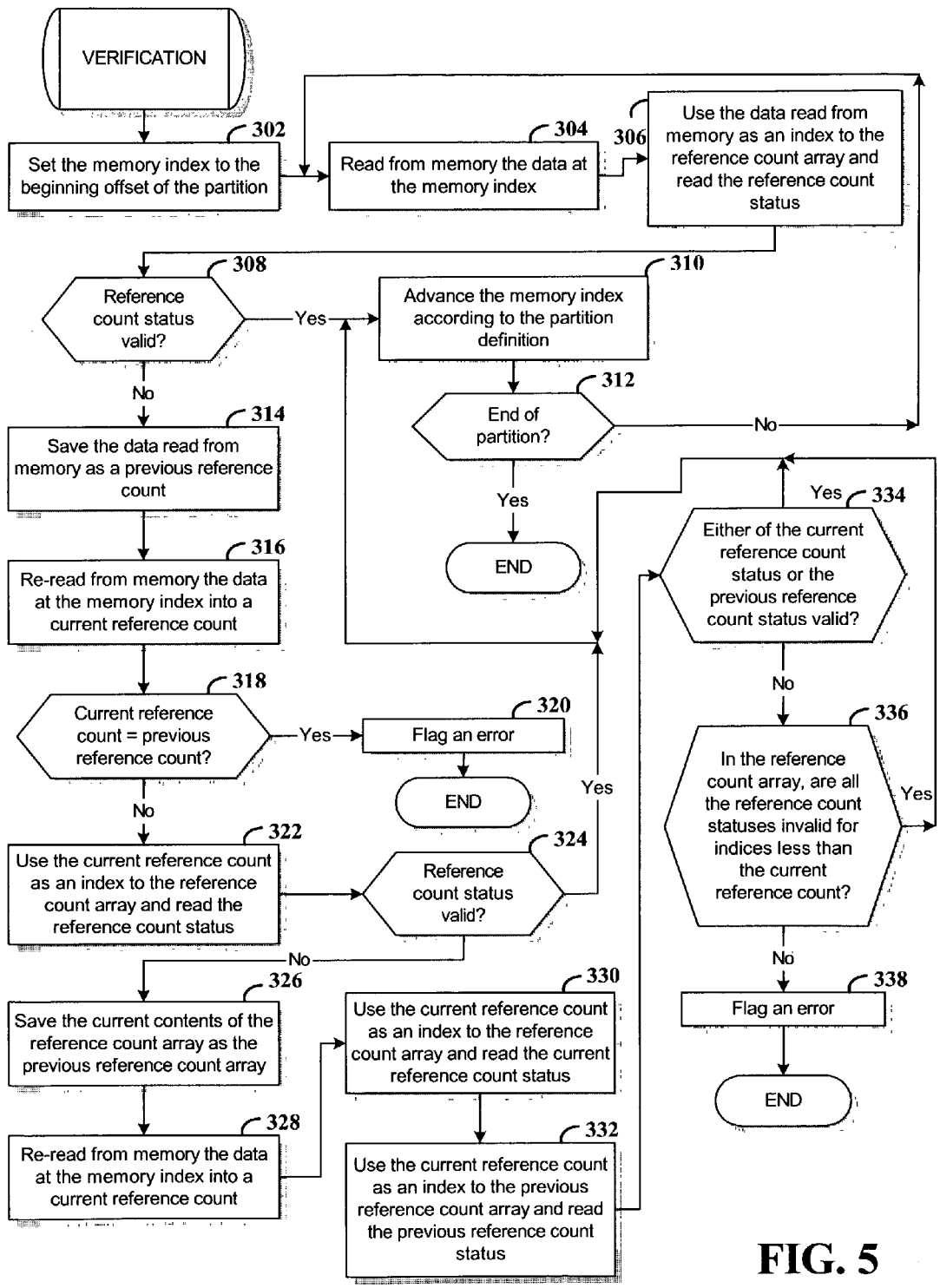
FIG. 5 is a flowchart of an example process for verifying the validity of values written by multiple threads to the area of memory.

FIG. 5 is a flowchart of an example process for verifying the validity of values written by multiple threads to the area of memory. Verification of memory contents can be performed at any time during thread execution. There is no requirement that updates to a partition are stalled or complete for verification to take place. Verification can be performed at any of the following times: 1) the same thread performing a write operation may immediately verify the results; 2) any thread may verify a partition after the partition has been written at least once; and 3) any thread may verify a partition any time after the entire target memory has been written at least once.

Thus, a thread executing on one processor may check the integrity of a memory location at the same time that that location is being modified by a thread on another processor. The reference count matrix, which is accessible to all threads in the program, is used to save information on expected values. If multiple threads are permitted to target the same partition, several reference count values are valid in the partition.

The process begins with setting a memory index to the beginning offset of the partition (step 302). The value at the address of the memory index is then read (step 304). Using the value read from memory and the partition number as indices, the reference count status is read from the reference count matrix (step 306). If the reference count status is valid (decision step 308), the memory index is advanced according to the partition definition (step 310). The process returns to read another value from the memory (step 304) until the end of the partition is reached (step 312).

If the reference count status is not valid, the value read from memory may still be valid in the event that the reference count was marked invalid after the value was read from memory. The data read from the memory is saved as a previous reference count (step 314), and the value is reread from memory as addressed by the memory index (step 316). If the current reference count is equal to the previous reference count (decision step (318), an error is flagged (step 320) and the verification process exits.

If the current and previous reference counts are not equal, the current reference count is used as an index into the reference count array to read the reference count status (step 322). If the reference count status is valid (decision step 324), the process returns to advance the memory index (step 310). Otherwise, the current status of all the reference counts for the partition is saved as the previous reference count array (step 326). The value at the memory index is reread from the memory as the current reference count (step 328). The current reference count is used to index and read the reference count status from both the reference count matrix and the previous reference count array (steps 330, 332). If either of the status values indicates a valid reference count value (decision step 334), the value read from memory is valid, and the process returns to advance the memory index (step 310). Otherwise, the value might still be valid if the reference count range containing the reference count value was not assigned at the time of the snapshot, but was later assigned, written, and invalided—all before the thread that performed the reread could check the reference count matrix. Thus, if in the reference count matrix all the reference count statuses are invalid for reference counts less than the current reference count (decision step 336), the value read from memory is valid, and the process returns to advance the memory index (step 310). Otherwise, an error is flagged (step 338), and the verification process exits.

FIG. 6 is a flowchart of a process performed by a feedback activity. The feedback activity routine attempts to find the parameter values that come closest to achieving a system-level test objective and attempts to do so in a minimal amount of time. During optimization, the feedback activity concentrates on those parameters that appear to have the largest positive influence (relative to the system-level goal) on the system behavior. Less time is spent adjusting parameters that have been found to have insignificant or negative affects on the outcome. Parameters that require large amount of time or overhead to change are also adjusted less frequently than other more responsive parameters.

The particular parameters selected for adjustment depend on the current test objective and the platform parameters that are available for measurement. For example, if the current test objective is to verify data coherency while maximizing main memory access, some of the parameters that might be adjusted include:

1. partition memory size—the size of the memory under test affects the residency of data in the system caches and consequently, the number of memory accesses made;
2. contiguous byte/increment byte counts—each of these has a direct bearing on the number if accesses to a given architectural structure (e.g., cache line, page, etc.) and consequently affects the number of memory accesses;
3. ratio of read to write functions—this ratio has a direct bearing on cache invalidation and the resulting number of memory accesses;
4. processors on which the access threads are assigned for execution—this affects the distribution of access requests from multiple platform access units; and
5. the number of active threads—this parameter affects the total number of memory accesses.

Each of these parameters has a direct impact on the amount of write concurrency (which causes cache line invalidation) that takes place across the entire range of the memory partition by multiple requesters, as well as the read operations that are necessary to verify data coherency.

Once an initial parameter set has been identified, and baseline measurements have been taken, the feedback activity can begin to make adjustments. The point at which changes to parameter values are incorporated in the executing test is determined by the speed with which the executing code can both recognize and respond to the changes.

When choosing which parameter values to adjust, the feedback activity follows these general rules: 1) values of critical parameters are not changed; 2) the type of the parameter (fixed, restricted, unrestricted) is maintained wherever possible; 3) random parameters are not changed to another type (except under special conditions); 4) changes are made in progressive increments, attempting to remain as close to the original focus area as possible; 5) values of parameters that are more easily acted on by the test execution unit(s) are changed first; and 6) parameter values are selected with the intent of getting closer to the system level goal. Further explanation of the various types of parameters (e.g., critical, fixed, restricted, and unrestricted), as well as focus area are found in the referenced patents/applications.

The parameter definitions further include information that indicates levels of difficulty ("difficulty levels") associated with changing the parameter type and the parameter value relative to incorporation by a test execution unit. This information is used to assess how difficult, how quickly, and at what level a parameter can be adjusted during execution. For example, in 2200 systems, assigning files and creating new processes involve different levels of system overhead. Thus, parameters associated with assigning files will have a different difficulty level than parameters associated with creating new processes. The difficulty levels are assigned by a user.

The number of difficulty levels that are defined and the criteria used for assigning parameters to these levels are implementation dependent. In one embodiment, parameters at the highest difficulty level require significant time and/or overhead to change. For example, changes to a parameter having a high difficulty level may require that execution be temporarily halted or require that changes be made only by the test execution engine, and only at specific times during execution.

Parameters having the lowest difficulty levels, on the other hand, require no special setup. These parameters can be adjusted at any time, and are frequently reread in the main-path of a test execution unit. Generally, parameters having higher difficulty levels are adjusted less frequently than parameters having lower difficulty levels.

In one embodiment, the difficulty levels are divided into two measures. One measure relates to the difficulty involved in reducing the current value of the parameter. The other relates to the difficulty involved in increasing the current value of the parameter. For example, marking a file invalid in a file table for the parameter of the number of target files requires relatively low overhead. However, assigning a new file requires significantly more overhead and can only be accomplished at relatively infrequent intervals during test execution for parameters such as the number of files/device or total number of files.

The parameter type indicates whether the parameter is a fixed value parameter, a restricted range parameter, or a random parameter. The type is not intrinsic to the parameter, but is determined by initial settings. The feedback activity attempts to maintain the parameter type during the course of execution. Fixed parameters remain fixed, restricted range parameters remain restricted range, and random parameters remain random whenever possible.

In addition to the parameter types of fixed, random, and restricted range, parameters can be further subdivided according to the type and number of allowable values. Parameter types refer to the current or assigned parameter values whereas value types refer to the allowable values and methodology for a parameter's modification. In the example embodiment, each parameter can be assigned a value type of discrete range, continuous range, or limited choice. Discrete range parameters are characterized by a relatively small number of possible values. Typically, a discrete range parameter would have less than a hundred possible discrete values. When adjusting discrete range parameters, changes are made incrementally and follow the path of positive change, should one exist. This is based on an initial assumption that the parameter has a linear, exponential, or otherwise continuously increasing, relationship to system behavior. During later optimization stages, when optimization along these lines is no longer possible, deviations from this incremental approach will be allowed.

Continuous range parameters, although not necessarily mathematically continuous, have a sufficiently large number of possible values that attempting them all is not possible. In addition, minor variations typically have little effect. For example, in adjusting the word count in data transfers the range of allowable values is quite large and variations in system behavior when adjusting the value by only a few words is not expected to be significant. When adjusting parameters of this type, a variant of the divide-and-conquer approach is used. The initial value is used to logically divide the range into two portions, and a measurement from each portion is taken. The best measurement becomes the basis for subdividing the portion in which it belongs into two new portions. The process of subdividing the range is repeated until no further progress is made, or the range has reached some minimum size.

Limited choice parameters have a fixed, small number of choices, for example, not more than four or five different values. In addition each different value has unknown effects on the system. For example, finding that an improvement occurred when changing from a first algorithm to a second algorithm allows no prediction as to the effect of changing from the second algorithm to a third algorithm. When selecting values for parameters of this type, each value is selected in turn. Selections can be made in any order. An example limited choice parameter is a workload distribution algorithm.

The feedback activity begins by sorting parameters by difficulty level (step 402), and then obtains baseline system performance measurements (step 404). Assuming three levels of difficulty, parameters are divided into three groups. Groups may include a combination of fixed value, restricted range, or randomly generated parameters depending on the associated difficulty levels. Critical parameters are not included, as they represent parameters that may not be adjusted.

Random (unrestricted) parameters are established as such because these parameters are expected to have an insignificant effect on the ability of the environment to achieve the associated system-level goal. Thus, random parameters are not optimal candidates for change. However, because interactions of variables cannot always be predicted, some exploration of these parameters is included.

In general, the feedback activity first attempts to optimize the set of parameters at the lowest difficulty level. A set of parameters is considered optimized when changes to any one of the set results in a measurement that is equal to the system-level goal, or as is more likely the case, further from the system-level goal than a previous reading. An individual parameter is considered optimized when both positive and negative changes have an adverse effect on the system measurement. It will be appreciated that the optimization is not absolute, but is dependent on the current values of other environmental parameters.

Once all parameters from the lowest difficulty level have been optimized, a single parameter from the next level of difficulty is selected and the value is adjusted until an optimal value is found. The lowest level parameters are then readjusted until they have been optimized relative to the new parameter value in the next level. This process is repeated until all parameters at the next level have been optimized at least once. Then the parameters at the next level of difficulty are optimized, with re-optimization of parameters at the lower levels with each changed parameter value.

At this stage of optimization, parameters at higher levels of difficulty are optimized individually, and parameters at the lower difficulty level are optimized based on changes at the higher levels. However, the original (higher level difficulty) parameter is not readjusted, or treated as part of this optimization set. This limits the number of changes that are made to higher difficulty level parameters. At some point in optimization there may be a time when no further changes parameter in parameter values can be made that will result in a positive gain. The optimization is then considered stable. At this time, boundaries between difficulty levels are removed, and the parameters are treated as one optimized set. In this way, more interactions between parameters can be explored.

When optimizing a set of parameters, the feedback activity proceeds in several stages. Except for the initial optimization stage, the other stages are repeated. The stages are shown in FIG. 6 and further described in the following paragraphs.

During the initial optimization stage (step 406), each parameter is optimized individually using the initial environment parameter values. The best value for a parameter is found while the current values of all other parameters are fixed. Once all parameters have been optimized once, the process is repeated. Because parameters may interact with each other, a change in one parameter value may mean a new optimal value for another. Recall that when fixed value parameters are adjusted, they are adjusted by assigning another fixed value, ideally a value that results in a measurement closer to the system-level goal. An example of this technique for optimizing a fixed value parameter follows.

Consider the case of a fixed, discrete range parameter with an initial value of 3, and an allowable range of [1, 2, 3, . . . , 10]. The first step in optimizing this parameter is to test the two adjacent values, 2 and 4, for the effects on the system performance measurement, and to record the effects of the change relative to the baseline. The next action depends on whether the change is negative, positive, or there is no change.

For example, if best value is currently 3 and the values 2 and 4 both result in a negative change, this stage of optimization is complete, and another parameter is selected for optimization. The current best parameter value remains 3. Note that it is still possible that this parameter may have a positive effect on the environment at some future time, since changes in other parameters may affect the behavior of this one.

If one of the adjacent values (2 or 4) results in a positive change, and the other results in a negative change, subsequent adjustments to the parameter value selections continue in the direction of the positive change, until such time as no further positive change improvement is observed.

If there is no significant change that results from adjacent values (2 or 4), the next adjacent values are selected (1 or 5). If there is still no change, values at the upper and lower bounds of the range are checked. If there is still no change, the parameter is (temporarily) abandoned, and attention turns to another fixed parameter.

When optimizing limited choice parameters, no direction (in terms of relative values) for improvement is assumed. Each value is selected in turn, and its effect on the system is measured. The value with the best (most positive) effect is the one that is selected. Testing of each value can be terminated prematurely in the event that the value of the parameter appears to have no significant effect on the behavior of the system.

For restricted range parameters, a range is selected instead of a single value. During initial optimization, the size of the range is left unchanged. However, the range is shifted to the right or left (numerically), looking for positive or negative changes in the performance measurement. For a discrete range parameter, the shift is one value to the right (or left). For a continuous range parameter, the shift is a selected percentage of the size of the original range, for example, 50%. As with fixed parameters, the shifts continue in the order of positive change.

After the initial optimization, parameters are grouped by response level and degree of interaction (step 408). As adjustments are made, the feedback activity tracks those parameters that appear to have little affect on the performance measurement, those parameters that cause a negative change, and those parameters that cause a significant positive change. The parameters are then grouped by relative response level and degree of interaction within each difficulty level. Those parameters that cause a positive change are placed in a higher level group within the difficulty level. Parameters that have a strong (positive) interaction with other parameters, in particular, specifically, those that require frequent adjustments on subsequent passes through the parameter list, are also placed in a higher level group. Optimization concentrates on those parameters with the most significant and positive interactions. This reordering and grouping of parameters is dynamic, and may change as new parameters or changes are introduced, and new interactions are found. The number of groups within a difficulty level is implementation specific. At a minimum, three groups would be required, one for parameters with positive responses, one for negative responses, and one for limited response.

Figure 7:
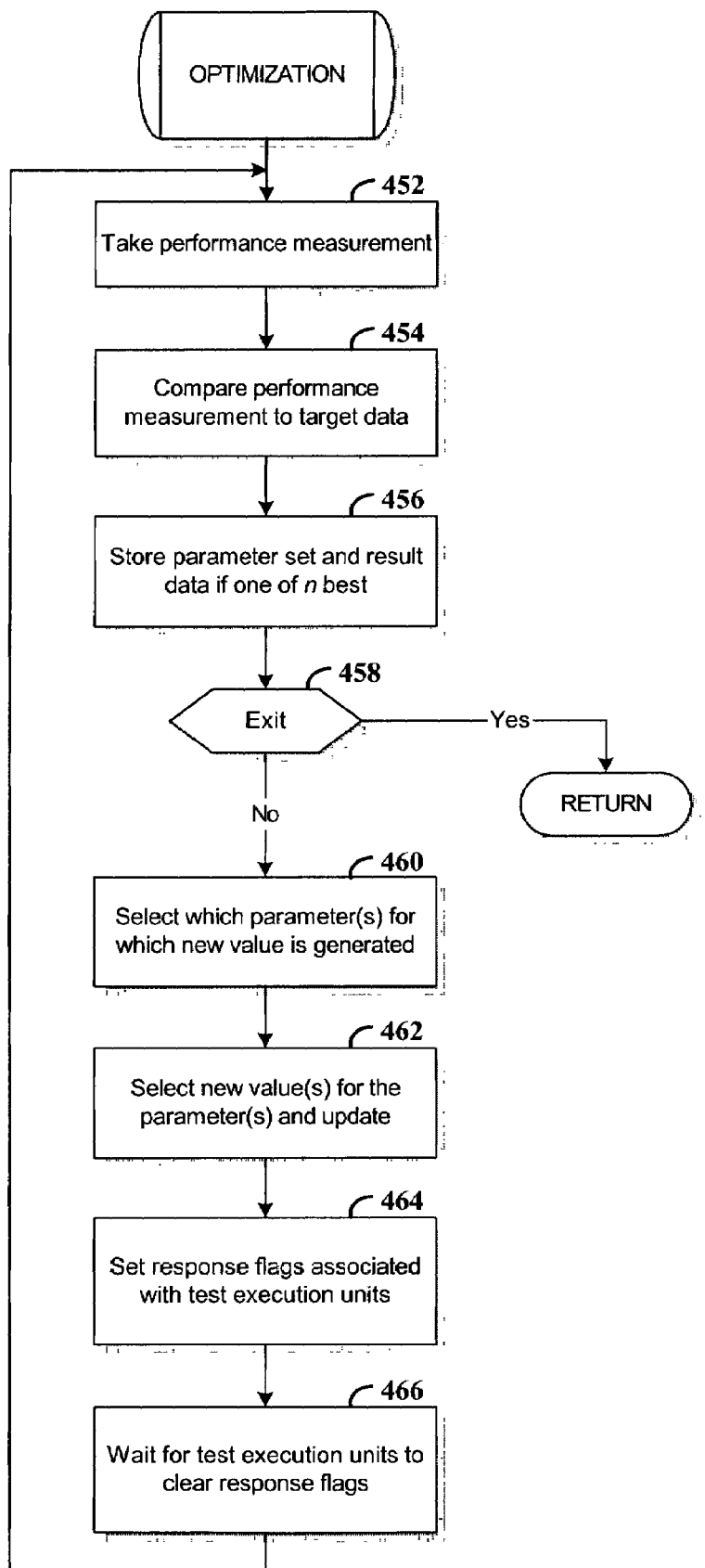
FIG. 7 is a flowchart of a process performed by the feedback activity in optimizing a selected parameter value.

Once the parameters have been grouped, optimization is performed within the response groups (step 410). During the initial optimization stage, several passes through the parameters are made. Information gained with each pass through the parameters is used to separate these parameters into groups according to their level of positive response, and degree of interaction with other parameters. The level of positive response is parameter-specific, relative to the system-level goal, and independent of other parameters. The degree of interaction is a quantitative measurement of how other parameter optimizations are affected by a change in a particular parameter value. Once parameters have been separated into groups, optimization begins to concentrate on those parameters that have been found to exhibit the largest positive results. Parameters in higher-level response groups are optimized more frequently than parameters in lower-level response groups. FIG. 7 illustrates an example process performed for optimization.

If optimization of a response group results in no changes, some steps can be skipped. For example, if optimization of a lower-level response group parameters results in no adjustment from the initial value, no optimization of higher-level response groups is required because there was no change in the lower level response group to affect the higher-level response group. In practice, parameters from the limited or negative interaction sets would infrequently result in changes.

The next stage of optimization optimizes parameters in successive increasing levels of difficulty (step 412). The parameters at each level of difficulty are optimized before continuing with parameters at the next level of difficulty. Based on the current optimized selections, a parameter value is adjusted until an optimal value is found. Again, the process of FIG. 7 is used for optimizing the parameters.

The parameter set is expanded and further optimization is performed after optimizing by increasing levels of difficulty (step 414). Optimization of the expanded parameter set occurs when no further optimization progress can be made by separately optimizing difficult parameters. This stage involves treating all parameters, regardless of their difficulty level as a single parameter set. Parameters are sorted into response groups according to the amount of positive influence and degree of interaction with other parameters in the set. Optimization by group continues as described above, until no further progress can be made.

The final stage of optimization is called the exploratory stage (step 414). During this stage, previously unexplored ranges and parameter values are tested in search of a more optimal solution. Less emphasis is placed on maintaining the same degree of environmental focus, and fewer assumptions are made about the individual functional relationships of parameters.

During the exploratory stage values of random parameters are allowed to vary. In addition, the values for one or more parameters are selected at random, from the set of previously unselected values. This defines a new starting point for the optimization. In "hill-climbing" jargon this constitutes finding a new starting position—one that may allow another (higher) peak to be found. In genetic algorithm jargon, genes are allowed to mutate. Depending on the overhead associated with changing values of difficult parameters, this stage may be moved ahead of the optimization of expanded parameter set stage.

There may be a higher degree of instability, and slightly longer periods of negative improvement during this stage than in other optimization stages. However, because no further improvement was attainable in the other stages, the exploration of other sets of parameter values is considered desirable. For example, consider the case of a fixed parameter having a discrete range of values of 1–10 and an initial value of 3, and a local maximum at this point. The initial value 3 is the best value attained from previous optimization stages During the exploratory stage, a value is selected from the previously unselected values: 4–10. Unselected values are those allowable values that have not been considered in prior stages of the optimization. Each parameter value in a range has a flag that is used to indicate when a value is selected. Values are selected, until one is found that results in a positive change, or some maximum number of non-positive changes have been attempted. In this case, testing each of the endpoints, as well as one value in the range 5–10 may be considered sufficient.

The exploratory stage for a restricted range parameter involves first contracting, then expanding the current range. Contracting a restricted parameter range uses a divide-and-conquer method similar to that described above in association with adjusting continuous range parameter values.

The exploratory stage also allows ranges to expand into previously unexplored areas of the range. For restricted range parameters, the original range is abandoned, and a new, larger range is defined. The new range spans the entire range of defined values for the parameter. The divide-and-conquer method is then used to find some subset of this range that produces results closer to the system level goal being measured.

In the case of a random parameter, the first step is implied, as the range of a random parameter is, by definition, the entire range of parameter values.

Without significant additional overhead, it is possible for the feedback activity to monitor the behavior of the system in other (non-goal) areas. For example, if the system level goal of the environment is to maximize the number of write bytes transferred per second, the feedback activity routine could simultaneously measure the average I/O queue size, the total number of requests per second, and the number of split requests. If desired, separate records could be kept for each of these measurements as well. Parameters are adjusted for maximum bytes per second. However, if during the course of this optimization one of the other measurements was found to exceed the previous "best" measurement, the saved set of parameter values could be updated.

This auxiliary information could be used to supply initial starting parameter values for the environment if the user wishes to override the environment goal. For example, the user may want to verify the integrity of word addressable files under conditions of maximum page faults, rather than maximum I/O volume.

FIG. 7 is a flowchart of a process performed by the feedback activity in optimizing a selected parameter value. The optimization process monitors the performance of the system by taking a performance measurement in a selected area of the system (step 452). The number and type of performance measurements that can be taken to support a given test objective depend on the specific platform under test. Example performance measurements include:

1. (the number of data read requests per requestor— represents the number of read operations made by each requester to cache/memory.
2. (the number of data write requests per requestor— represents the number of data modification requests made by each requestor to cache/memory
3. the number of cache misses per requester (or cache data fetch operations)—indicates the number of times memory must be accessed to obtain the latest copy of the data; and
4. the number of cache invalidations per requestor— indicates the number of data areas that must be written to memory.

These measurements allow the test to determine the number of memory accesses and by which requesters the memory accesses are made. If it is determined that the access pattern from a number of requesters is causing a high level of cache hits, the processing can be modified to cause requests to be made to memory instead. If it is determined that the ratio of read to write requests is not as desired, the ratio of read and write access functions, along with the designated processors for execution, can be modified to achieve the desired result.

The performance measurement is compared to a target value for the environment (step 454), and the set of parameter values is stored if the performance measurement is one of n best measurements taken. It will be appreciated that storage of the set of parameter values is made by type of computing arrangement in accordance with one embodiment of the invention.

If the optimization process determines that either performance measurement has reached a desired level or that no further progress is expected (decision step 458), the process returns control to the feedback activity of FIG. 4. Otherwise, one or more parameters are selected for generation of new parameter values (steps 460, 462). The response flags associated with the changed parameter values are set for the test execution units (step 464). When all the test execution units have responded by clearing the respective response flags (step 466), the optimization process returns to take another performance measurement (step 452).

Accordingly, the present invention provides, among other aspects, a method and apparatus for verification of data coherency. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for testing memory operations in a multiprocessor data processing arrangement, comprising:
   logically partitioning a selected portion of memory into partitions respectively associated with a plurality of threads;
   assigning disjoint sets of values to the threads for writing to the associated partitions;
   wherein each partition is defined by a beginning offset, an ending offset, a contiguous byte count, and an increment value, the beginning offset being a position in the selected portion of memory, relative to a starting address of the portion of memory, at which the partition begins, the ending offset being a position in the selected portion of memory, relative to the starting address of the portion of memory, at which the partition ends, the contiguous byte count being a number of consecutively addressed bytes that belong to the partition, and the increment value being a number of bytes that are not in the partition and that separate two sets of contiguously addressed bytes of the partition;
   writing the sets of values to memory by the plurality of threads;
   verifying that values in the memory are consistent with the values written by the plurality of threads;
   measuring performance characteristics of the data processing system while writing the values; and
   selectively adjusting, in response to the performance characteristics relative to target performance characteristics, parameters that control writing by the plurality of threads.

2. The method of claim 1, further comprising assigning the threads to execute on different processors.

3. The method of claim 1, further comprising varying the number of threads that are active in selected time intervals.

4. The method of claim 1, wherein each partition includes contiguously addressable memory locations.

5. The method of claim 1, wherein each partition includes non-contiguously addressable memory locations.

6. The method of claim 1, wherein at least one partition includes contiguously addressable memory locations.

7. The method of claim 1, wherein at least one partition includes non-contiguously addressable memory locations.

8. A computer-implemented method for testing memory operations in a multiprocessor data processing arrangement, comprising:
   allocating a portion of memory of selected size;
   dividing the portion of memory into a plurality of partitions in accordance with a partition scheme;

wherein each partition is defined by a beginning offset, an ending offset, a contiguous byte count, and an increment value, the beginning offset being a position in the selected portion of memory, relative to a starting address of the portion of memory, at which the partition begins, the ending offset being a position in the selected portion of memory, relative to the starting address of the portion of memory, at which the partition ends, the contiguous byte count being a number of consecutively addressed bytes that belong to the partition, and the increment value being a number of bytes that are not in the partition and that separate two sets of contiguously addressed bytes of the partition;

distributing a plurality of threads for execution on a plurality of processors;

establishing a target data set representing target performance characteristics;

writing assigned values by each thread to an associated one of the partitions, wherein each thread is associated with no more than one partition, and the values written by a thread are unique relative to values written by other ones of the threads;

verifying that contents of locations in the portion of memory are consistent with associated partitions and assigned values of the threads;

measuring performance characteristics of the data processing system while writing the values; and selectively adjusting the partition scheme in response to the performance characteristics relative to the target data set.

9. The method of claim 8, further comprising:
selectively adjusting the number of threads executing on the processors in response to the performance characteristics relative to the target data set.

10. The method of claim 8, further comprising:
selectively adjusting the size of the portion of memory in response to the performance characteristics relative to the target data set.

11. The method of claim 8, wherein each partition includes contiguously addressable memory locations.

12. The method of claim 8, wherein each partition includes non-contiguously addressable memory locations.

13. The method of claim 8, wherein at least one partition includes contiguously addressable memory locations.

14. The method of claim 8, wherein at least one partition includes non-contiguously addressable memory locations.

15. An apparatus for testing memory operations in a multiprocessor data processing arrangement, comprising:
means for logically partitioning a selected portion of memory into partitions respectively associated with a plurality of threads;
means for assigning disjoint sets of values to the threads for writing to the associated partitions;
wherein each partition is defined by a beginning offset, an ending offset, a contiguous byte count, and an increment value, the beginning offset being a position in the selected portion of memory, relative to a starting address of the portion of memory, at which the partition begins, the ending offset being a position in the selected portion of memory, relative to the starting address of the portion of memory, at which the partition ends, the contiguous byte count being a number of consecutively addressed bytes that belong to the partition, and the increment value being a number of bytes that are not in the partition and that separate two sets of contiguously addressed bytes of the partition;
means for writing the sets of values to memory by the plurality of threads;
means for verifying that values in the memory are consistent with the values written by the plurality of threads;
means for measuring performance characteristics of the data processing system while writing the values; and
means for selectively adjusting, in response to the performance characteristics relative to target performance characteristics, parameters that control writing by the plurality of threads.

16. A computer-implemented method for testing memory operations in a multiprocessor data processing arrangement, comprising:
logically partitioning a selected portion of memory into partitions respectively associated with a plurality of threads;
assigning disjoint sets of values to the threads for writing to the associated partitions;
wherein each partition is defined by a beginning offset, an ending offset, a contiguous byte count, and an increment value, the beginning offset being a position in the selected portion of memory, relative to a starting address of the portion of memory, at which the partition begins, the ending offset being a position in the selected portion of memory, relative to the starting address of the portion of memory, at which the partition ends, the contiguous byte count being a number of consecutively addressed bytes that belong to the partition, and the increment value being a number of bytes that are not in the partition and that separate two sets of contiguously addressed bytes of the partition;
assigning the threads to execute on different processors;
writing the sets of values to memory by the plurality of threads;
verifying that values in the memory are consistent with the values written by the plurality of threads.

17. The method of claim 16, further comprising varying the number of threads that are active in selected time intervals.

18. The method of claim 16, wherein each partition includes contiguously addressable memory locations.

19. The method of claim 16, wherein each partition includes non-contiguously addressable memory locations.

20. The method of claim 16, wherein at least one partition includes contiguously addressable memory locations.

21. The method of claim 16, wherein at least one partition includes non-contiguously addressable memory locations.

* * * * *